United States Patent
Komada

(10) Patent No.: US 8,084,764 B2
(45) Date of Patent: Dec. 27, 2011

(54) SEMICONDUCTOR LIGHT EMITTING DEVICE AND NITRIDE SEMICONDUCTOR LIGHT EMITTING DEVICE

(75) Inventor: Satoshi Komada, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 175 days.

(21) Appl. No.: 12/076,812

(22) Filed: Mar. 24, 2008

(65) Prior Publication Data

US 2008/0237571 A1  Oct. 2, 2008

(30) Foreign Application Priority Data

Mar. 28, 2007  (JP) .................................. 2007-085146

(51) Int. Cl.
  *H01L 29/06* (2006.01)
(52) U.S. Cl. ............... 257/14; 257/11; 257/79; 257/97; 257/94; 257/115; 438/31
(58) Field of Classification Search .................... 257/11, 257/14, 22, 115, 79, 97, 94; 438/31
  See application file for complete search history.

(56) References Cited

U.S. PATENT DOCUMENTS 4,701,774 A * 10/1987 McIlroy et al. ................. 257/13
5,932,896 A * 8/1999 Sugiura et al. ................. 257/97
6,614,060 B1 * 9/2003 Wang et al. .................... 257/103
2006/0094145 A1 * 5/2006 Otsuka et al. .................. 438/31

FOREIGN PATENT DOCUMENTS

JP  2004-064080  2/2004

* cited by examiner

*Primary Examiner* — Kenneth Parker
*Assistant Examiner* — Dale E Page
(74) *Attorney, Agent, or Firm* — Harness, Dickey & Pierce, P.L.C.

(57) ABSTRACT

The present invention is a semiconductor light emitting device including an n-type semiconductor layer, an active layer, a first p-type semiconductor layer between the n-type semiconductor layer and the active layer, and a second p-type semiconductor layer on the opposite side of the first p-type semiconductor layer from the active layer. Further, the present invention is a nitride semiconductor light emitting device including an n-type nitride semiconductor layer, a nitride semiconductor active layer, a first p-type nitride semiconductor layer between the n-type nitride semiconductor layer and the nitride semiconductor active layer, and a second p-type nitride semiconductor layer on the opposite side of the first p-type nitride semiconductor layer from the nitride semiconductor active layer.

12 Claims, 5 Drawing Sheets

SEMICONDUCTOR LIGHT EMITTING DEVICE AND NITRIDE SEMICONDUCTOR LIGHT EMITTING DEVICE

This nonprovisional application is based on Japanese Patent Application No. 2007-085146 filed with the Japan Patent Office on Mar. 28, 2007, the entire contents of which are hereby incorporated by reference.

BACKGROUND OF THE INVENTION

1. Field of the Invention

The present invention relates to a semiconductor light emitting device and a nitride semiconductor light emitting device, and particularly relates to a semiconductor light emitting device and a nitride semiconductor light emitting device which are capable of suppressing the deterioration of crystallinity of an active layer and have high light emitting efficiency and high current density.

2. Description of the Background Art

The structure of a conventional nitride semiconductor light emitting device is generally a structure in which an n-type nitride semiconductor layer, an n-type or an undoped nitride semiconductor active layer, and a p-type nitride semiconductor layer are layered in this order on a substrate.

In a nitride semiconductor light emitting device with this structure, since the nitride semiconductor active layer is an n-type and the effective mass of an electron is smaller than that of a hole, the hole concentration in the nitride semiconductor active layer at high current density becomes extremely small compared with the electron concentration. Therefore, since excess electrons approach into to the region of the p-type nitride semiconductor layer and recombine with holes in the region of the p-type nitride semiconductor layer at a ratio in which the electrons cannot be ignored in the region of the nitride semiconductor active layer, there has been a problem that light emitting efficiency of the nitride semiconductor light emitting device decreases.

Hence, in Japanese Patent Laying-Open No. 2004-064080, a nitride semiconductor light emitting device is proposed in which at least one of the nitride semiconductor active layers is made to be p-type.

SUMMARY OF THE INVENTION

However, the activation energy of a p-type impurity is very large in a semiconductor. For example, the activation energy of Mg generally used as a p-type impurity in a nitride semiconductor is about 200 meV, and it is about 10 times the activation energy of an n-type impurity.

Therefore, in order to obtain a desired p-type carrier concentration in the nitride semiconductor active layer of the nitride semiconductor light emitting device described in Japanese Patent Laying-Open No. 2004-064080, since it is necessary to dope p-type impurities at about 100 times the p-type carriers, the deterioration of crystallinity of the nitride semiconductor active layer due to doping the p-type impurities with a high concentration is a worry.

Further, in the case of using an InGaN layer in a well layer of multiple quantum well structure of the nitride semiconductor active layer in the nitride semiconductor light emitting device described in Japanese Patent Laying-Open 2004-064080, since it is necessary to form the layer at a low temperature due to extremely high vapor pressure of In, it is difficult to activate the well layer into a p-type at such a low temperature.

An object of the present invention is to provide a semiconductor light emitting device and a nitride semiconductor light emitting device which are capable of suppressing the deterioration of crystallinity of an active layer and have high light emitting efficiency and high current density.

In the present invention, "light emitting efficiency" indicates external quantum efficiency that is the product of internal quantum efficiency, injection efficiency, and light outgoing efficiency. Here, the internal quantum efficiency refers to a ratio of the number of photons generated in the active layer to the number of electrons injected into the active layer, the injection efficiency refers to a ratio of the number of recombinations of holes and electrons in the active layer to the total number of recombinations of holes and electrons in the device, and the light outgoing efficiency refers to a ratio of the number of photons out of the device to the number of photons generated in the active layer.

The present invention is a semiconductor light emitting device including an n-type semiconductor layer, an active layer, a first p-type semiconductor layer between the n-type semiconductor layer and the active layer, and a second p-type semiconductor layer on the opposite side of the side of the first p-type semiconductor layer from the active layer.

Further, the present invention is a nitride semiconductor light emitting device including an n-type nitride semiconductor layer, a nitride semiconductor active layer, a first p-type nitride semiconductor layer between the n-type nitride semiconductor layer and the nitride semiconductor active layer, and a second p-type nitride semiconductor layer on the opposite side of the first p-type nitride semiconductor layer from the nitride semiconductor active layer.

The nitride semiconductor light emitting device in the present invention preferably includes a GaN layer or an InGaN layer arranged so as to be contacted with the first p-type nitride semiconductor layer.

In the nitride semiconductor light emitting device of the present invention, the first p-type nitride semiconductor layer preferably includes a nitride semiconductor layer containing Al.

In the nitride semiconductor light emitting device of the present invention, the ratio of the number of Al atoms to the total number of Al, Ga, and In atoms contained in the first p-type nitride semiconductor layer is preferably 0.05 to 0.5.

In the nitride semiconductor light emitting device of the present invention, a nitride semiconductor layer not containing p-type impurities is between the first p-type nitride semiconductor layer and the nitride semiconductor active layer.

In the nitride semiconductor light emitting device of the present invention, the atomic concentration of the p-type impurities in the first p-type nitride semiconductor layer is preferably $5 \times 10^{19}/cm^3$ or less.

In the nitride semiconductor light emitting device of the present invention, the atomic concentration of the p-type impurities in the nitride semiconductor active layer is preferably $1 \times 10^{19}/cm^3$ or less.

In the nitride semiconductor light emitting device of the present invention, the nitride semiconductor active layer is preferably undoped.

In the nitride semiconductor light emitting device of the present invention, the second p-type nitride semiconductor layer preferably includes a p-type InGaN layer.

In the nitride semiconductor light emitting device of the present invention, the ratio of the number of In atoms to the total number of In and Ga atoms in the p-type InGaN layer is preferably 0.1 or less.

In the nitride semiconductor light emitting device of the present invention, the nitride semiconductor active layer preferably has a multiple quantum well structure with 2 or more wells.

In the present description, Al represents aluminum, Ga represents gallium, In represents indium, and N represents nitrogen.

In the present invention, each of the atomic concentration of the p-type impurities and the atomic concentration of the n-type impurities can be quantitatively calculated with a method such as SIMS (Secondary Ion Mass Spectrometry).

According to the present invention, a semiconductor light emitting device and a nitride semiconductor light emitting device can be provided which are capable of suppressing the deterioration of crystallinity of an active layer and have high light emitting efficiency and high current density.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
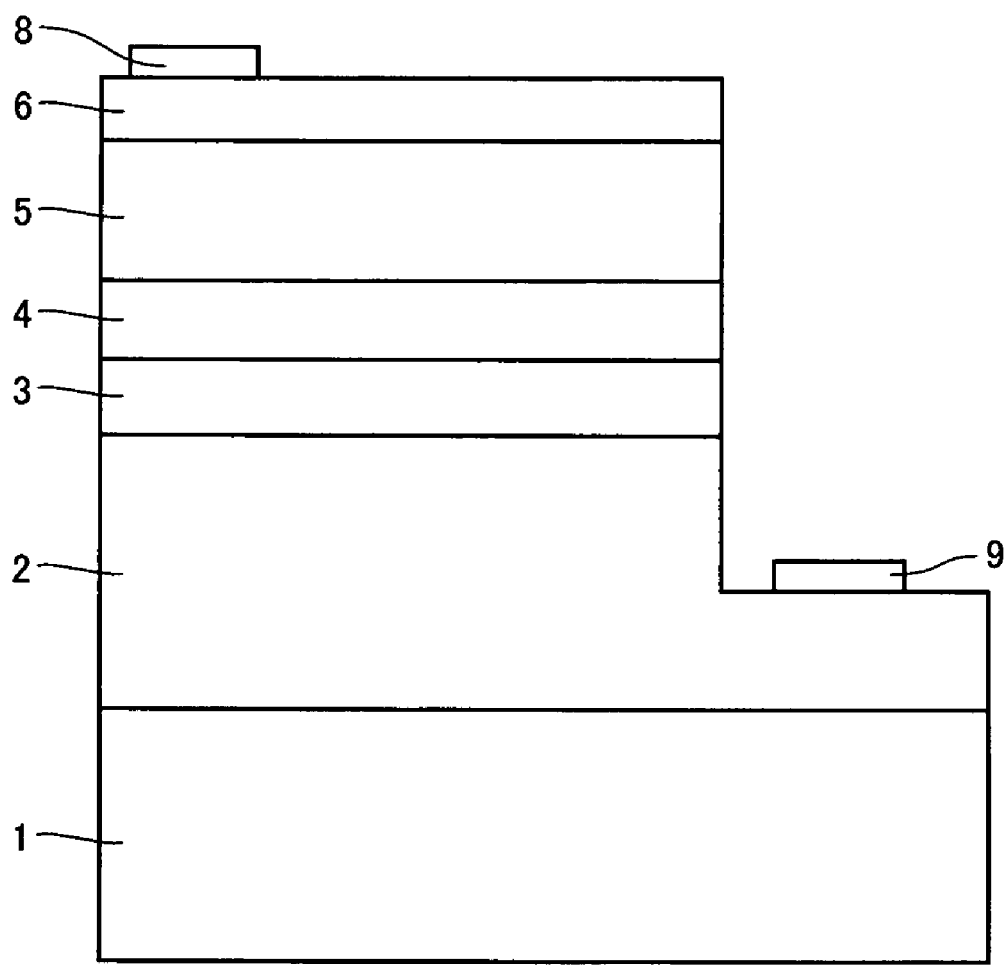
FIG. 1 is a cross-sectional schematic view of one preferable example of a nitride semiconductor light emitting device in the present invention.

Below, an embodiment of the present invention is described. Moreover, in the drawings of the present invention, the same reference numerals represent the same parts or corresponding parts.

FIG. 1 is a cross-sectional schematic view of one preferable example of a nitride semiconductor light emitting device in the present invention. The nitride semiconductor light emitting device shown in FIG. 1 has a structure in which an n-type nitride semiconductor layer 2, a first p-type nitride semiconductor layer 3, a nitride semiconductor active layer 4, a second p-type nitride semiconductor layer 5, and a translucent electrode 6 are layered on a substrate 1 in this order. Then, a p-side electrode 8 is formed on the surface of translucent electrode 6, and an n-side electrode 9 is formed on the surface of n-type nitride semiconductor layer 2.

Figure 2:
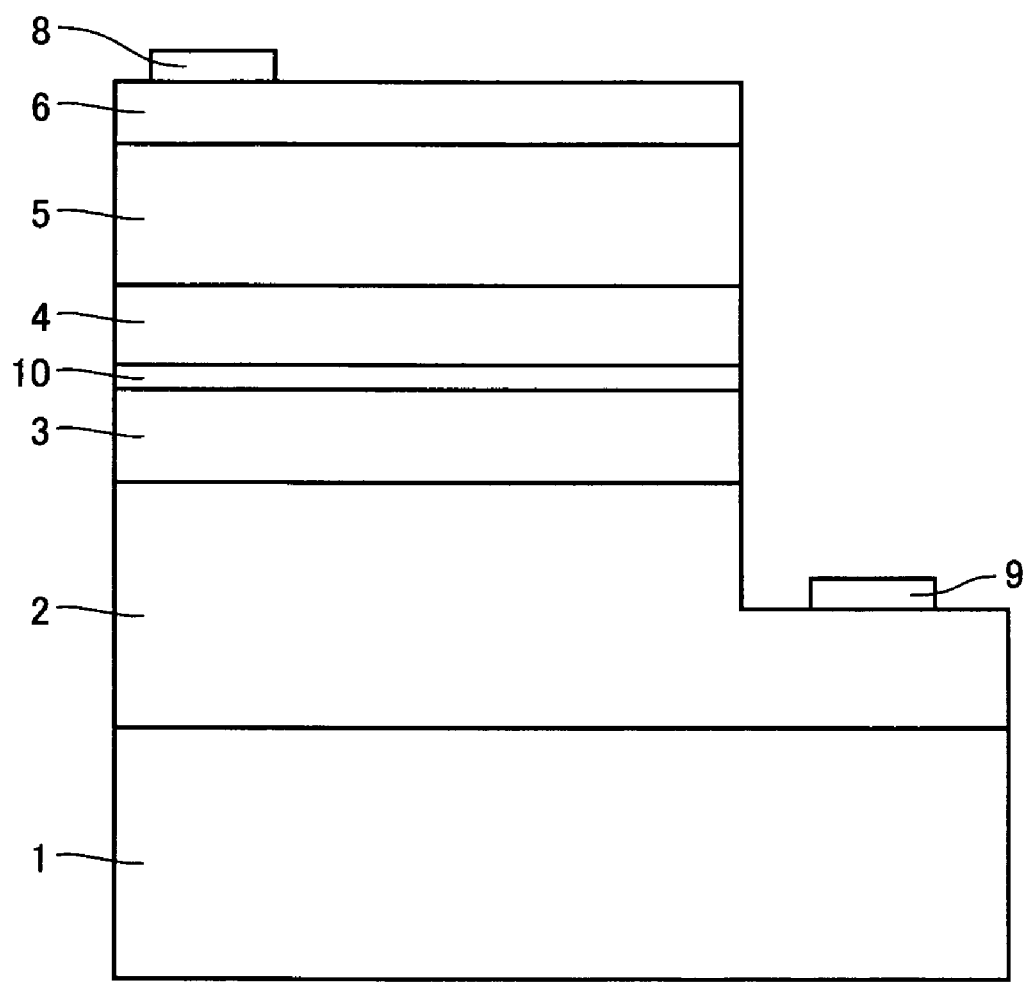
FIG. 2 is a cross-sectional schematic view of another preferable example of the nitride semiconductor light emitting device in the present invention.

Further, FIG. 2 is a cross-sectional schematic view of another preferable example of the nitride semiconductor light emitting device in the present invention. Here, the nitride semiconductor light emitting device shown in FIG. 2 has the same configuration as the nitride semiconductor light emitting device in FIG. 1 except that a nitride semiconductor layer 10 in which p-type impurities are not doped is formed between first p-type nitride semiconductor layer 3 and nitride semiconductor active layer 4.

Further, the nitride semiconductor light emitting device of the present invention shown in FIGS. 1 and 2 is characterized by including first p-type nitride semiconductor layer 3 between n-type nitride semiconductor layer 2 and nitride semiconductor active layer 4, and second p-type nitride semiconductor layer 5 on the opposite side of first p-type nitride semiconductor layer 3 from nitride semiconductor active layer 4.

Such a configuration is allowed to obtain a nitride semiconductor light emitting device with high light emitting efficiency and high current density, and at the same time, to suppress deterioration of crystallinity of nitride semiconductor active layer 4 even when nitride semiconductor active layer 4 is not doped with a large amount of p-type impurities.

Figure 3:
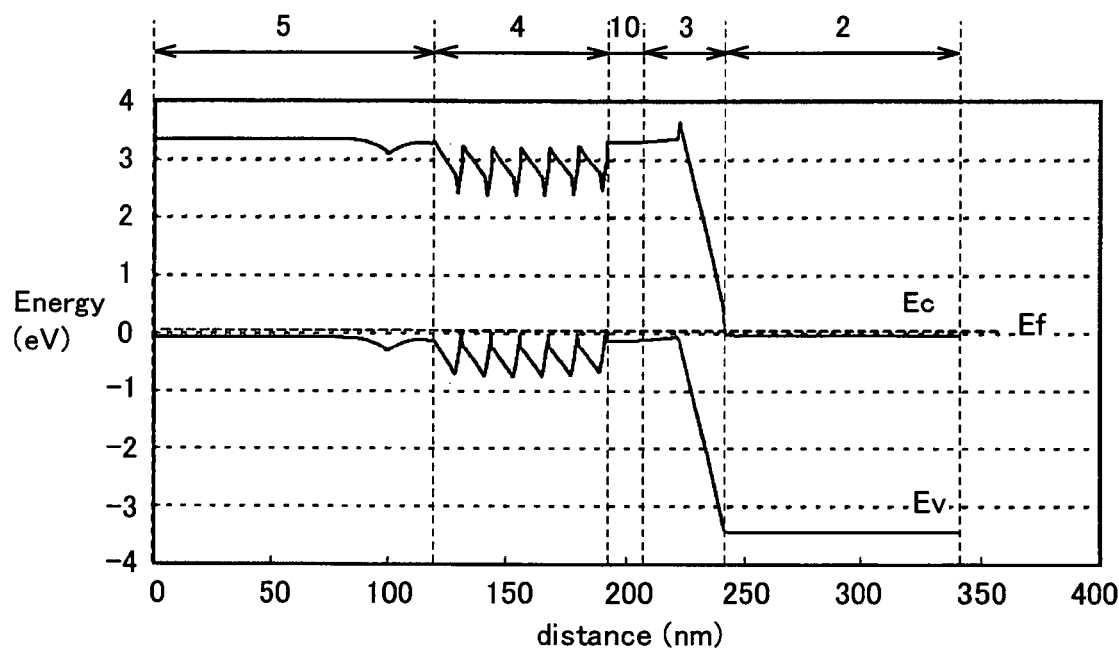
FIG. 3 is an energy band diagram of one preferable example of the nitride semiconductor light emitting device in the present invention.

FIG. 3 is an energy band diagram of one preferable example of the nitride semiconductor light emitting device in the present invention. Moreover, a vertical axis represents a band gap energy (eV) and a lateral axis represents a distance (nm) from the surface of second p-type nitride semiconductor layer 5 in FIG. 3. That is, it means that the larger the distance (nm) in the lateral axis, the closer it becomes to the side of substrate 1 from the surface of second p-type nitride semiconductor layer 5.

Further, the energy band gap diagram shown in FIG. 3 shows the band gap of a nitride semiconductor light emitting device having the configuration shown in FIG. 2 and using a nitride semiconductor layer made of the following materials. That is, an n-type GaN layer is used as n-type nitride semiconductor layer 2 shown in FIG. 2, and a layered body, in which a p-type $Al_{0.15}Ga_{0.85}N$ layer (carrier concentration: $5 \times 10^{17}/cm^3$) having a thickness of 20 nm and a p-type GaN layer (carrier concentration: $5 \times 10^{17}/cm^3$) having a thickness of 10 nm are formed in this order from the side of n-type nitride semiconductor layer 2, is used as first p-type nitride semiconductor layer 3. Further, an undoped GaN layer having a thickness of 10 nm (not shown in FIG. 1) is used as nitride semiconductor layer 10. In addition, an active layer having a multiple quantum well structure with 6 well layers, in which an undoped $In_{0.2}Ga_{0.8}N$ layer is used as a well layer and an undoped GaN layer is used as a barrier layer, is used as nitride semiconductor active layer 4. Furthermore, a layered body, in which a p-type $In_{0.03}Ga_{0.97}N$ layer (carrier concentration: $1 \times 10^{18}/cm^3$) having a thickness of 20 nm and a p-type GaN layer (carrier concentration: $1 \times 10^{18}/cm^3$) having a thickness of 100 nm are formed in this order from the side of nitride semiconductor active layer 4 side, is used as second p-type nitride semiconductor layer 5.

In a nitride semiconductor light emitting device with such a configuration, an electron flows from the right side to the left side of FIG. 3 and a hole flows from the left side to the right side of FIG. 3 by applying a forward bias voltage. Also, supposing the case of driving this nitride semiconductor light emitting device at high current density, the hole concentration in nitride semiconductor active layer 4 becomes larger than the electron concentration, and the tendency in which the majority of carriers in nitride semiconductor active layer 4 becomes holes becomes large.

Since the electron has a larger moving speed and the diffusion length becomes longer than that of the hole due to a smaller effective mass than that of the hole, in the case that a majority of carriers in nitride semiconductor active layer 4 are electrons, particularly in the case of high current density, the ratio of the number of electrons diffusing to the region of second p-type nitride semiconductor layer 5 to the number of electrons injected into nitride semiconductor active layer 4 cannot be ignored, the injecting efficiency decreases, and as a result, the light emitting efficiency decreases. On the other hand, in the case that holes in nitride semiconductor active layer 4 are a majority carrier, electrons become a minority carrier even in the case of driving at high current density, and the light emitting efficiency does not decrease since the electrons and the holes recombine in nitride semiconductor active layer 4 before reaching to the region of second p-type nitride semiconductor layer 5.

Therefore, for the above reason, the light emitting efficiency of the nitride semiconductor light emitting device can be increased in the nitride semiconductor light emitting device of the present invention also in the case of injecting current at high current density since the amount of the electrons overflowing to the side of second p-type nitride semiconductor layer 5 can be reduced without recombining with the holes in nitride semiconductor active layer 4.

In the nitride semiconductor light emitting device of the present invention, deterioration of the crystallinity of nitride semiconductor active layer 4 can be suppressed since p-type impurities do not have to be doped into nitride semiconductor active layer 4 at a large amount or at all.

Furthermore, as described above, in the case that first p-type nitride semiconductor layer 3 includes a configuration in which a nitride semiconductor layer containing Al and having a relatively large band gap and a nitride semiconductor layer not containing Al and having a relatively small band gap are contacted and layered, due to the production of two-dimensional electron gas in the interface between the p-type AlGaN layer and the p-type GaN layer on the side of nitride semiconductor active layer 4 and the generation of a piezo electronic field caused by a lattice mismatching between the p-type AlGaN layer constituting first p-type nitride semiconductor layer 3 and nitride semiconductor active layer 4 (the InGaN layer or the GaN layer), the hole concentration of nitride semiconductor active layer 4 can be made to be effectively high, and the depletion region in nitride semiconductor active layer 4 can be formed in the n-type nitride semiconductor layer 2 side. Thus, the amount of the electrons overflowing to the second p-type nitride semiconductor layer 5 side can be reduced without recombining with the holes in nitride semiconductor active layer 4.

Here, (i) a two-dimensional electron gas positively charged is generated at the interface of the p-type AlGaN layer of first p-type nitride semiconductor layer 3 on the nitride semiconductor active layer 4 side due to the difference in electron affinity between the p-type AlGaN layer constituting first p-type nitride semiconductor layer 3 and nitride semiconductor active layer 4 (an In GaN layer or a GaN layer) on first p-type nitride semiconductor layer 3. (ii) A piezo electric field is generated due to a lattice mismatching between the p-type AlGaN layer of first p-type nitride semiconductor layer 3 and nitride semiconductor active layer 4 (the InGaN layer or the GaN layer), and by this piezo electric field, an electric field is applied so that the second p-type nitride semiconductor layer 5 side of nitride semiconductor active layer 4 is negative. (iii) Since nitride semiconductor active layer 4 is undoped and second p-type nitride semiconductor layer 5 on nitride semiconductor active layer 4 is p-type, an electric field is applied so that the second p-type nitride semiconductor layer 5 side of nitride semiconductor active layer 4 is positive.

Since the electric fields of (ii) and (iii) offset each other and the interface of the p-type AlGaN layer on the nitride semiconductor active layer 4 side is positively charged, nitride semiconductor active layer 4 effectively becomes p-type.

Moreover, from the viewpoint of applying an electric field so that the interface of the p-type AlGaN layer on the nitride semiconductor active layer 4 side is positive by generating a piezo electric field, a layer right below the p-type AlGaN layer constituting first p-type nitride semiconductor layer 3 is preferably an n-type or a p-type GaN layer.

For example, a nitride semiconductor layer made of a p-type $Al_xIn_yGa_zN$ ($0 \leq x \leq 1$, $0 \leq y \leq 1$, $0 \leq z \leq 1$, $x+y+z \neq 0$) crystal can be used as first p-type nitride semiconductor layer 3. However, from the viewpoint of producing two-dimensional electron gas as described above, first p-type nitride semiconductor layer 3 preferably contains a layer containing Al. In the above-described formula, x represents the mixed crystal ratio of Al, y represents the mixed crystal ratio of In, and z represents the mixed crystal ratio of Ga.

That is, in the case that first p-type nitride semiconductor layer 3 has a configuration in which a p-type $Al_{x1}In_{y1}Ga_{z1}N$ ($0<x1 \leq 1$, $0 \leq y1 \leq 1$, $0 \leq z1 \leq 1$, $x1+y1+z1 \neq 0$) layer and a p-type $Al_{x2}In_{y2}Ga_{z2}N$ ($0 \leq x2 \leq 1$, $0 \leq y2 \leq 1$, $0 \leq z2 \leq 1$, $x2+y2+z2 \neq 0$) layer are layered in this order from the n-type nitride semiconductor layer 2 side, two-dimensional electron gas can be produced in the interface of these layers on the nitride semiconductor active layer 4 side. However, from the viewpoint of producing the two-dimensional electron gas as described above, the p-type $Al_{x1}In_{y1}Ga_{z1}N$ ($0<x1 \leq 1$, $0 \leq y1 \leq 1$, $0 \leq z1 \leq 1$, $x1+y1+z1 \neq 0$) layer is preferably a p-type AlGaN layer containing no In, and the p-type $Al_{x2}In_{y2}Ga_{z2}N$ ($0 \leq x2 \leq 1$, $0 \leq y2 \leq 1$, $0 \leq z2 \leq 1$, $x2+y2+z2 \neq 0$) layer is preferably a p-type GaN layer or a p-type InGaN layer (a p-type $In_{y2}Ga_{z2}N$ ($0 \leq y2 \leq 1$, $0 \leq z2 \leq 1$, $y2+z2 \neq 0$) layer) containing no Al.

In the case that the foremost surface of first p-type nitride semiconductor layer 3 on the nitride semiconductor active layer 4 side is constituted with a p-type $Al_{x1}In_{y1}Ga_{z1}N$ ($0<x1 \leq 1$, $0 \leq y1 \leq 1$, $0 \leq z1 \leq 1$, $x1+y1+z1 \neq 0$) layer, from the viewpoint of producing two-dimensional electron gas, a layer contacting with the foremost surface is preferably an n-type or an undoped GaN layer not containing Al or an n-type or an undoped InGaN layer not containing Al. Moreover, the n-type or the undoped GaN layer not containing Al or the n-type or the undoped InGaN layer not containing Al, contacting with the p-type $Al_{x1}In_{y1}Ga_{z1}N$ ($0<x1 \leq 1$, $0 \leq y1 \leq 1$, $0 \leq z1 \leq 1$, $x1+y1+z1 \neq 0$) layer that becomes the foremost surface of first p-type nitride semiconductor layer 3 on the nitride semiconductor active layer 4 side, has a function of suppressing diffusion of the p-type impurities into nitride semiconductor active layer 4.

Further, the ratio of the number of Al atoms to the total number of Al, Ga, and In atoms in the p-type $Al_{x1}In_{y1}Ga_{z1}N$ ($0<x1 \leq 1$, $0 \leq y1 \leq 1$, $0 \leq z1 \leq 1$, $x1+y1+z1 \neq 0$) layer constituting first p-type nitride semiconductor layer 3 is preferably 0.05 to 0.5. In the case that this ratio is 0.05 to 0.5, the effect due to the generation of the two-dimensional electron gas described above tends to be exhibited sufficiently. Further, in the case that this ratio exceeds 0.5, there is a fear that problems occur such as making the resistance of first p-type nitride semiconductor layer 3 high and the generation of cracks.

Further, the atomic concentration of the p-type impurities in first nitride semiconductor layer 3 is preferably $5 \times 10^{19}/cm^3$ or less. In this case, transmission such as lattice defects and dislocation to nitride semiconductor active layer 4 tend to be able to be suppressed when nitride semiconductor active layer 4 is formed by epitaxial growth with a MOCVD (Metal Chemical Vapor Deposition) method.

Here, x1 and x2 represent the mixed crystal ratio of Al, y1 and y2 represent the mixed crystal ratio of In, and z1 and z2 represent the mixed crystal ratio of Ga.

Further, first p-type nitride semiconductor layer 3 and nitride semiconductor active layer 4 may contact as in the configuration shown in FIG. 1. However, it is preferable to form nitride semiconductor layer 10 not containing p-type impurities between first p-type nitride semiconductor layer 3 and nitride semiconductor active layer 4 as in the configuration shown in FIG. 2 since the p-type impurities can be suppressed from diffusing from first p-type nitride semiconductor layer 3 to nitride semiconductor active layer 4. Here, from the viewpoint of sufficiently suppressing the diffusion of the p-type impurities, the layer thickness of nitride semiconductor layer 10 is preferably 10 nm to 50 nm.

Further, nitride semiconductor active layer 4 preferably has a multiple quantum well structure that is a periodic structure in which a well layer made of $In_aGa_bN$ ($0 \leq a \leq 1$, $0 \leq b \leq 1$, $a+b \neq 0$) and a barrier layer made of $Al_sIn_tGa_uN$ ($0 \leq s \leq 1$, $0 \leq t \leq 1$, $0 \leq u \leq 1$, $s+t+u \neq 0$) are layered alternatively. Here, s represents the mixed crystal ratio of Al, a and t represents the mixed crystal ratio of In, and b and u represent the mixed crystal ratio of Ga.

From the viewpoint of suppressing deterioration of crystallinity of nitride semiconductor active layer 4, the atomic concentration of the p-type impurities in nitride semiconductor active layer 4 is preferably $1 \times 10^{19}/cm^3$ or less, and preferably is undoped.

The number of wells in nitride semiconductor active layer 4 is preferably 2 or more from the viewpoint of increasing the state density of nitride semiconductor active layer 4 and suppressing overflow of the carriers.

The diffusion length of electrons in nitride semiconductor active layer 4 differs largely depending on the hole concentration in nitride semiconductor active layer 4. However, since the diffusion length is about 1 μm when the hole concentration in nitride semiconductor active layer 4 is $1 \times 10^{18}/cm^3$ for example, the total layer thickness of nitride semiconductor active layer 4 is preferably 1 μm or more. For example, when the case that one layer of each well layer and barrier layer is layered is made to be one period for example, the number of wells becomes 50 when the layer thickness of the one period is 20 nm.

A layer made of a p-type $Al_{x3}In_{y3}Ga_{z3}N$ ($0 \leq x3 \leq 1$, $0 \leq y3 \leq 1$, $0 \leq z3 \leq 1$, $x3+y3+z3 \neq 0$) crystal can be used as second p-type nitride semiconductor layer 5 for example. Here, x3 represents the mixed crystal ratio of Al, y3 represents the mixed crystal ratio of In, and z3 represents the mixed crystal ratio of Ga.

Among these layers, a layer made of a p-type $In_{y3}Ga_{z3}N$ ($0 \leq y3 \leq 1$, $0 \leq z3 \leq 1$, $y3+z3 \neq 0$) crystal not containing Al (a p-type InGaN layer) is preferably used as second p-type nitride semiconductor layer 5. In the case of using the p-type InGaN layer as second p-type nitride semiconductor layer 5, the hole concentration in nitride semiconductor active layer 4 on the second p-type nitride semiconductor layer 5 side tends to be able to be increased effectively, and the electron amount that overflows to the second p-type nitride semiconductor layer 5 side in the case of injecting current at high current density can be decreased. That is, since a piezo electronic field in which the interface of nitride semiconductor active layer 4 on the second p-type nitride semiconductor layer 5 side becomes positive is generated by a lattice mismatching between the p-type InGaN layer constituting second p-type nitride semiconductor layer 5 and nitride semiconductor active layer 4, the hole concentration of the second p-type nitride semiconductor layer 5 side in nitride semiconductor active layer 4 is improved effectively.

Further, only the p-type InGaN layer can be formed as second p-type nitride semiconductor layer 5. However, the p-type InGaN layer and the p-type GaN layer can be formed from the nitride semiconductor active layer 4 side in this order.

In the case that second p-type nitride semiconductor layer 5 is configured with a layered body of a p-type InGaN layer and a p-type GaN layer, the ratio of the number of In atoms to the total number of In and Ga atoms in the p-type InGaN layer is preferably 0.1 or less. In this case, an increase of the contact resistance at the interface of the p-type InGaN layer and the p-type GaN layer can be suppressed.

A substrate made of sapphire, SiC (silicon carbide), Si (silicon), ZnO (zinc oxide), etc. can be used as substrate 1.

A nitride semiconductor layer made of an n-type $Al_kIn_lGa_mN$ ($0 \leq k \leq 1$, $0 \leq l \leq 1$, $0 \leq m \leq 1$, $k+l+m \neq 0$) crystal can be used as n-type nitride semiconductor layer 2 for example. Here, k represents the mixed crystal ratio of Al, l represents the mixed crystal ratio of In, and m represents the mixed crystal ratio of Ga.

Further, n-side electrode 9 formed on n-type nitride semiconductor layer 2 is preferably formed so as to have an ohmic contact using at least one kind of metal selected from the group consisting of Ti (titanium), Hf (hafnium), and Al for example. Here, a part of the surface of first n-type nitride semiconductor layer 2 is exposed by etching, and n-side electrode 9 can be formed on its exposed face.

A film made of Pd (palladium), Ni (nickel), ITO (Indium Tin Oxide), n-type GaN, etc. can be used as translucent electrode 6 formed on second p-type nitride semiconductor layer 5 for example.

A layered body of an Au (gold) film or a Ti (titanium) film with an Al film can be used as p-side electrode 8 formed on translucent electrode 6 for example.

A nitride semiconductor light emitting diode device with a top and bottom electrode structure can be made by making the n-type nitride semiconductor layer 2 side a light outgoing side and the second p-type nitride semiconductor layer 5 side a supporting substrate side by pasting the second p-type nitride semiconductor layer 5 side of the above-described wafer after the growth of second p-type nitride semiconductor layer 5 onto a conductive supporting substrate prepared separately and forming at least one kind of metal film selected from the group consisting of Al, Pt (platinum), and Ag (silver) having high reflectance on the supporting substrate side.

In the present invention, at least one kind selected from the group consisting of Si, Ge (germanium), and O (oxygen) for example is preferably doped as the n-type impurities.

In the present invention, Mg (magnesium) and/or Zn (zinc), etc. can be doped as the p-type impurities. However, Mg having small activation energy is preferably doped as the p-type impurity.

The case of a nitride semiconductor light emitting device is described above. However, the present invention is not limited to the nitride semiconductor light emitting device, and it is applicable to a semiconductor light emitting device in which a nitride semiconductor layer is not used.

EXAMPLES

Example 1

Figure 4:
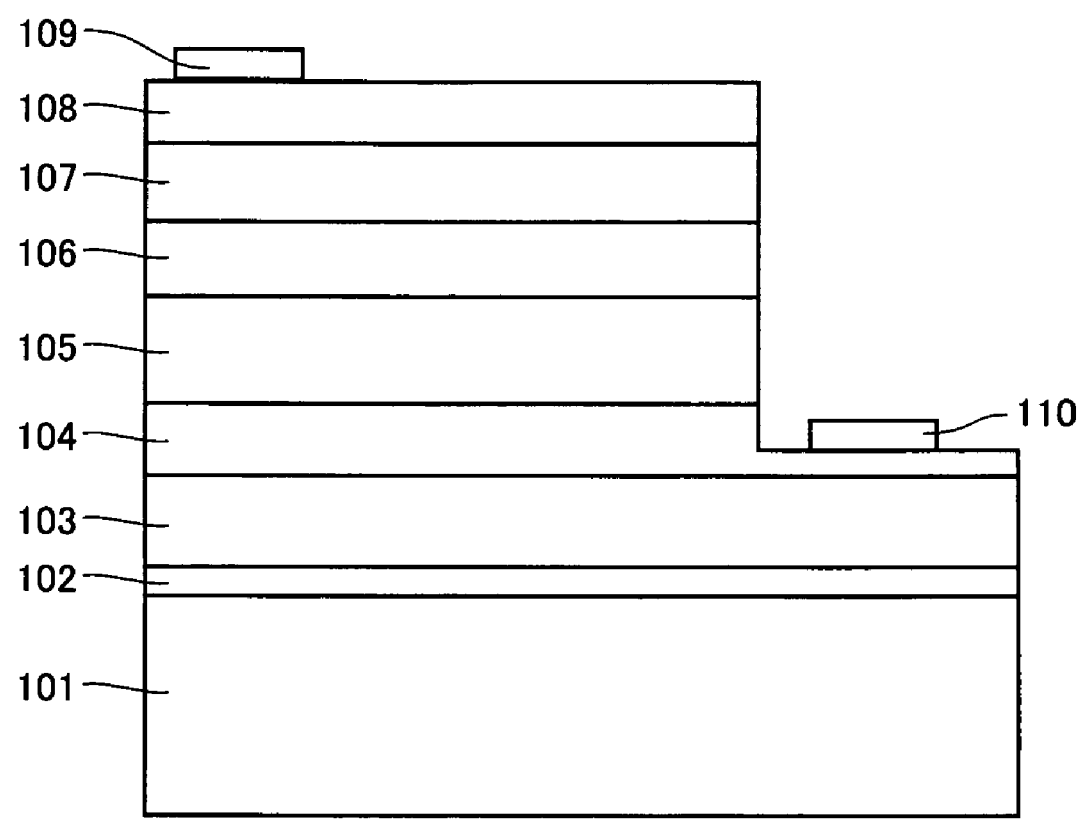
FIG. 4 is a cross-sectional schematic view of a nitride semiconductor light emitting diode device in Example 1.

In Example 1, the nitride semiconductor light emitting diode having a configuration shown in the schematic cross-sectional view of FIG. 4 was manufactured.

First, a sapphire substrate 101 was set in a reaction furnace of a MOCVD machine. Then, the temperature of sapphire substrate 101 was raised to 1050° C. while hydrogen flowed in the reaction furnace, to perform cleaning of the surface (C face) of sapphire substrate 101.

Next, the temperature of sapphire substrate 101 was lowered to 510° C. and hydrogen as carrier gas and ammonia and TMG (trimethyl gallium) as raw material gas flowed in the reaction furnace, to grow a GaN buffer layer 102 on the surface of sapphire substrate 101 (C face) to a thickness of about 20 nm with a MOCVD method.

The temperature of sapphire substrate 101 was raised to 1050° C. and hydrogen as carrier gas, ammonia and TMG as raw material gas, and silane as impurity gas flowed in the reaction furnace, to grow an n-type GaN under-layer 103 (carrier concentration: $1 \times 10^{18}/cm^3$) doped with Si on GaN buffer layer 102 to a thickness of 6 μm with a MOCVD method.

An n-type GaN contact layer 104 is grown on n-type GaN under-layer 103 to a thickness of 0.5 μm with a MOCVD method in the same manner as in n-type GaN under-layer 103 except that Si is doped so that the carrier concentration becomes $5 \times 10^{18}/cm^3$.

Then, the temperature of sapphire substrate 101 was kept to 1050° C. and hydrogen as carrier gas, ammonia and TMG as raw material gas, and CP2Mg (cyclopentadienyl magnesium) as impurity gas flowed in the reaction furnace, to grow a p-type GaN layer 105 doped with Mg at a concentration of $1 \times 10^{19}/cm^3$ on n-type GaN contact layer 104 to a thickness of 20 nm with a MOCVD method.

Next, the temperature of sapphire substrate 101 was lowered to 700° C., nitrogen as carrier gas and ammonia, TMG, and TMI (trimethyl indium) as raw material gas flowed in the reaction furnace, and an undoped $In_{0.20}Ga_{0.80}N$ layer having a thickness of 2.5 nm and an undoped GaN layer having a thickness of 18 nm were alternatively grown in only six cycles on p-type GaN layer 105 with a MOCVD method, to form an active layer 106 having a multiple quantum well structure on p-type GaN contact layer 105. It is needless to say that TMI did not flow in the reaction furnace when the GaN layer was grown in the formation of active layer 106.

Subsequently, the temperature of sapphire substrate 101 was raised to 950° C. and hydrogen as carrier gas, ammonia and TMG as raw material gas, and CP2Mg as impurity gas flowed in the reaction furnace, to grow a p-type GaN layer 107 doped with Mg at a concentration of $1 \times 10^{20}/cm^3$ on active layer 106 to a thickness of about 0.1 μm with a MOCVD method.

The temperature of sapphire substrate 101 was lowered to 700° C. and nitrogen as carrier gas flowed in the reaction furnace, to perform annealing.

The wafer after the above-described annealing was taken out from the reaction furnace, and a mask patterned in a prescribed shape was formed on the surface of p-type GaN layer 107 that was the top layer of the wafer. A part of the surface of n-type GaN contact layer 104 was exposed by performing etching on a part of the above-described wafer from the p-type GaN layer 107 side with a RIE (Reactive Ion Etching) method.

A Pd film 108 having a thickness of 7 nm was formed as a translucent electrode on almost the entire face of p-type GaN layer 107, and an Au film 109 having a thickness of 0.5 μm was formed as a p-side electrode on Pd film 108. On the other hand, a layered body 110 of a Ti film and an Al film was formed as an n-side electrode on the surface of n-type GaN contact layer 104 exposed by etching.

After that, a nitride semiconductor light emitting diode device of Example 1 having a configuration shown in the schematic cross-sectional view of FIG. 4 was produced by dicing the wafer into a plurality of chips.

In the nitride semiconductor light emitting diode device in Example 1, a decreasing rate of the peak light emitting efficiency due to increase of the current density in the relationship between the current density and the light emitting efficiency described later is allowed to be small compared with the nitride semiconductor light emitting diode device in Comparative Example, and as a result, even current injection at high current density exceeding 50 A/cm² for example allows the light emitting efficiency to be high.

Further, active layer 106 is more preferably undoped as the nitride semiconductor light emitting diode device of Example 1 on realizing a high light emitting efficiency, and it is preferable next to this to make the atomic concentration of p-type impurities of active layer 106 to be $1 \times 10^{19}/cm^3$ or less.

Example 2

With the same conditions and the same method as in Example 1, n-type GaN contact layer 104 was grown.

Next, the temperature of sapphire substrate 101 was kept to 1050° C. and hydrogen as carrier gas, ammonia, TMG, and TMA (trimethyl aluminum) as raw material gas, and CP2Mg as impurity gas flowed in the reaction furnace, to grow an p-type $Al_{0.25}Ga_{0.75}N$ layer doped with Mg at a concentration of $1 \times 10^{19}/cm^3$ on n-type GaN contact layer 104 to a thickness of 20 nm with a MOCVD method.

Then, the temperature of sapphire substrate 101 was kept to 1050° C. and hydrogen as carrier gas, ammonia and TMG as raw material gas, and CP2Mg as impurity gas flowed in the reaction furnace, to grow a p-type GaN layer doped with Mg at a concentration of $1 \times 10^{19}/cm^3$ on the p-type $Al_{0.25}Ga_{0.75}N$ layer to a thickness of 10 nm with a MOCVD method.

After that, a nitride semiconductor light emitting diode device in Example 2 was manufactured by performing steps after the growth of active layer 106 with the same conditions and the same method as in Example 1.

In the relationship between the current density and the light emitting efficiency, the configuration of the nitride semiconductor light emitting diode device in Example 2 allows the decreasing rate of the peak light emitting efficiency due to increase of the current density to be small compared with the nitride semiconductor light emitting diode device in Example 1. As a result, current injection at high current density also allows the light emitting efficiency to be high.

In the nitride semiconductor light emitting diode device in Example 2, the light emitting efficiency can be higher than that of Example 1 in the case that the ratio of the number of Al atoms to the total number of Al and Ga atoms in the p-type $Al_{0.25}Ga_{0.75}N$ layer is 0.05 or more Therefore, high resistance, generation of cracks, etc. of the layer can be suppressed in the case that the ratio is 0.5 or less.

The concentration of Mg atoms in the p-type $Al_{0.25}Ga_{0.75}N$ layer is preferably $5 \times 10^{19}/cm^3$ or less. In the case that the concentration of Mg atoms exceeds $5 \times 10^{19}/cm^3$, crystallinity of active layer 106 deteriorates and invites a decrease of the light emitting efficiency.

Example 3

With the same conditions and the same method as in Example 1, n-type GaN contact layer 104 was grown.

Next, the temperature of sapphire substrate 101 was kept to 1050° C. and hydrogen as carrier gas, ammonia, TMG, and TMA as raw material gas, and CP2Mg as impurity gas flowed in the reaction furnace, to grow a p-type $Al_{0.25}Ga_{0.75}N$ layer on n-type GaN contact layer 104 to a thickness of 20 nm with a MOCVD method.

Then, the temperature of sapphire substrate 101 was kept to 1050° C. and hydrogen as carrier gas, and ammonia and TMG as raw material gas flowed in the reaction furnace, to grow an undoped GaN layer on the p-type $Al_{0.25}Ga_{0.75}N$ layer to a thickness of 20 nm with a MOCVD method.

After that, the nitride semiconductor light emitting diode device in Example 3 was manufactured by performing steps after the growth of active layer 106 with the same conditions and the same method as in Example 1.

In the relationship between the current density and the light emitting efficiency, the nitride semiconductor light emitting diode device in Example 3 allows the decreasing rate of the peak light emitting efficiency due to increase of the current density to be small compared with the nitride semiconductor light emitting diode device in Example 2. As a result, current injection at high current density also allows the light emitting efficiency to be high.

Further, since the undoped GaN layer suppresses Mg from diffusing from the p-type $Al_{0.25}Ga_{0.75}N$ layer to active layer 106, high light emitting efficiency can be realized independent from the current density.

Furthermore, the n-type GaN layer may be formed by doping Si that is the n-type impurity using silane etc. as impurity gas instead of forming the undoped GaN layer. However, since a depletion region reaches to active layer 106 in the case of doping Si at a larger atomic concentration than $5 \times 10^{18}/cm^3$, and as a result, a decrease of the hole concentration in active layer 106 is invited, the atomic concentration of the n-type impurities in the n-type GaN layer is preferably $5 \times 10^{18}/cm^3$ or less, and most preferably is undoped.

Example 4

With the same conditions and the same method as in Examples 1, 2, and 3, active layer 106 was grown.

Next, the temperature of sapphire substrate 101 was raised to 850° C. and nitrogen as carrier gas, ammonia, TMG, and TMI as raw material gas, and CP2Mg as impurity gas flowed in the reaction furnace, to grow a p-type $In_{0.03}Ga_{0.97}N$ layer doped with Mg at a concentration of $1 \times 10^{20}/cm^3$ on active layer 106 to a thickness of 20 nm with a MOCVD method.

Then, the temperature of sapphire substrate 101 was raised to 950° C. and hydrogen as carrier gas, ammonia and TMG as raw material gas, and CP2Mg as impurity gas flowed in the reaction furnace, to grow a p-type GaN layer doped with Mg at a concentration of $1 \times 10^{20}/cm^3$ on a p-type $In_{0.03}Ga_{0.97}N$ layer to a thickness of 100 nm with a MOCVD method.

After that, the nitride semiconductor light emitting diode device in Example 4 was manufactured by performing steps after the formation of Pd film 108 with the same conditions and the same method as in Examples 1, 2, and 3.

In the relationship between the current density and the light emitting efficiency, the configuration of the nitride semiconductor light emitting diode device in Example 4 allows the decreasing rate of the peak light emitting efficiency due to increase of the current density to be small compared with the nitride semiconductor light emitting diode device in Examples 1, 2, and 3. Among these, the nitride semiconductor light emitting diode device in Example 4 was most preferably manufactured with the same conditions and the same method as in Example 3 except for the above conditions.

In the case that the ratio of the number of In atoms to the total number of In and Ga in the p-type $In_{0.03}Ga_{0.97}N$ layer of the nitride semiconductor light emitting diode device in Example 4 is 0.1 or less, an increase of the driving voltage can be suppressed.

On the other hand, the above-described ratio of the number of In atoms to obtain the result as described above is preferably 0.03 or more in the case that active layer 106 made in 6 cycles and its thickness is 105 nm, and it is preferably 0.01 or more in the case that active layer 106 made in 2 cycles and its thickness is 35 nm.

A p-type GaN layer having a thickness of about 10 nm may be layered by being grown between the p-type $In_{0.03}Ga_{0.97}N$ layer and the p-type GaN layer with the temperature of sapphire substrate 101 being 850° C. This case is preferable in the respect that there is a tendency that evaporation of In can be suppressed when the temperature increases after the growth of the p-type $In_{0.03}Ga_{0.97}N$ layer.

Example 5

With the same conditions and the same method as in Examples 1, 2, and 3, p-type GaN layer 105 was grown.

Next, the temperature of sapphire substrate 101 was lowered to 700° C., nitrogen as carrier gas, and ammonia, TMG, and TMI as raw material gas flowed in the reaction furnace, and an undoped $In_{0.20}Ga_{0.80}N$ layer having a thickness of 2.5 nm and an undoped GaN layer having a thickness of 15 nm were alternatively grown in an arbitrary cycle on p-type GaN layer 105 with a MOCVD method, to form an active layer 106 having a multiple quantum well structure on p-type GaN contact layer 105. Moreover, it was needless to say that TMI did not flow in the reaction furnace when the GaN layer was grown in the formation of light emitting layer 105.

After that, the nitride semiconductor light emitting diode device in Example 5 was manufactured by performing steps after the formation of p-type GaN layer 107 with the same conditions and the same method as in Examples 1, 2, and 3.

The configuration of the nitride semiconductor light emitting diode device in Example 5 allows the overflow of the carriers from the well layer to be small compared with the case that active layer 106 which is a single quantum well structure, and even current injection at high current density exceeding 50 A/cm$^2$ allows the light emitting efficiency to be high.

Further, the upper limit of the number of cycles of active layer 106 in the nitride semiconductor light emitting diode device in Example 5 is preferably set so that the total layer thickness of active layer 106 is made smaller than the diffusion length of electrons which is the minority carrier in active layer 106. For example, the well number can be changed to 57 since the hole concentration of active layer 106 has an order of about $1 \times 10^{17}$ to $1 \times 10^{18}/cm^3$, and the diffusion length of the electron at that time is about 1 μm in the case that a layer structure is made to be the more preferable condition for Examples 1, 2, 3, and 4.

Comparative Example 1

The nitride semiconductor light emitting diode device in Comparative Example 1 was manufactured with the same conditions and the same method as in Example 1 except that p-type GaN layer 105 was not grown.

Figure 5:
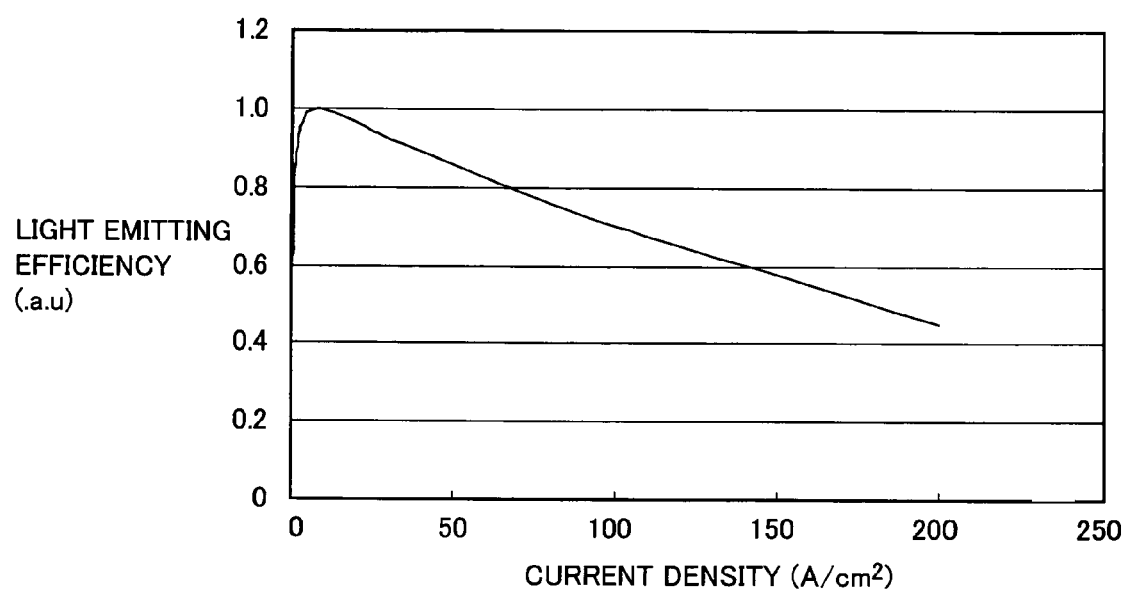
FIG. 5 is a view showing the relationship between the current density of current injected into the nitride semiconductor light emitting diode device in Comparative Example 1 and the light emitting efficiency.

FIG. 5 shows the relationship of the current density of the current injected in the nitride semiconductor light emitting diode device in Comparative Example 1 and the light emitting efficiency. As shown in FIG. 5, the light emitting efficiency has its peak when the current density is 7 A/cm$^2$, and the light efficiency decreases as the current density becomes larger than that. The decreasing rate of the peak of the current density when current with a current density of 50 A/cm$^2$ is injected is about 13% in the nitride semiconductor light emitting diode device in Comparative Example 1.

Since the light emitting efficiency of a semiconductor light emitting device such as a nitride semiconductor light emitting diode device can be improved at high current density according to the present invention, the semiconductor light emitting device and the nitride semiconductor light emitting device in the present invention can be applied to a light source etc. in the field of illumination for example.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light emitting device comprising:
   an n-type nitride semiconductor layer;
   a nitride semiconductor active layer;
   a first p-type nitride semiconductor layer between said n-type nitride semiconductor layer and said nitride semiconductor active layer; and
   a second p-type nitride semiconductor layer on the opposite side of said first p-type nitride semiconductor layer from said nitride semiconductor active layer,
   wherein said first p-type nitride semiconductor layer is a layer that is distinct from said nitride semiconductor active layer, said second p-type nitride semiconductor layer includes a p-type $Al_{x3}In_{y3}Ga_{z3}N$ ($0 \leq x3 \leq 1$, $0 \leq y3 \leq 1$, $0 \leq z3 \leq 1$, $x3+y3+z3 \neq 0$) layer in contact with said nitride semiconductor active layer, and said nitride semiconductor active layer includes an undoped nitride semiconductor layer at the most adjacent side to said first p-type nitride semiconductor layer.

2. The nitride semiconductor light emitting device according to claim 1 comprising a GaN layer or an InGaN layer arranged so as to be contacted with said first p-type nitride semiconductor layer.

3. The nitride semiconductor light emitting device according to claim 1, wherein said first p-type nitride semiconductor layer includes a nitride semiconductor layer containing Al.

4. The nitride semiconductor light emitting device according to claim 3, wherein the ratio of the number of Al atoms to the total number of Al, Ga, and In atoms contained in said first p-type nitride semiconductor layer is 0.05 to 0.5.

5. The nitride semiconductor light emitting device according to claim 1 comprising a nitride semiconductor layer not containing p-type impurities between said first p-type nitride semiconductor layer and said nitride semiconductor active layer.

6. The nitride semiconductor light emitting device according to claim 1, wherein the atomic concentration of the p-type impurities in said first p-type nitride semiconductor layer is $5 \times 10^{19}/cm^3$ or less.

7. The nitride semiconductor light emitting device according to claim 1, wherein the atomic concentration of the p-type impurities in said nitride semiconductor active layer is $1 \times 10^{19}/cm^3$ or less.

8. The nitride semiconductor light emitting device according to claim 1, wherein said nitride semiconductor active layer is undoped.

9. The nitride semiconductor light emitting device according to claim 1, wherein said nitride semiconductor active layer has a multiple quantum well structure with 2 or more wells.

10. The nitride semiconductor light emitting device according to claim 1, wherein said first p-type nitride semiconductor layer includes a p-type AlGaN layer and a p-type GaN layer on said p-type AlGaN layer.

11. The nitride semiconductor light emitting device according to claim 1, wherein said second p-type nitride semiconductor layer includes a p-type InGaN layer and a p-type GaN layer on said p-type InGaN layer.

12. The nitride semiconductor light emitting device according to claim 11, wherein the ratio of the number of In atoms to the total number of In and Ga atoms in said p-type InGaN layer is 0.1 or less.

* * * * *